United States Patent
Jeon et al.

(10) Patent No.: US 7,339,648 B2
(45) Date of Patent: Mar. 4, 2008

(54) APPARATUS FOR MANUFACTURING LIQUID CRYSTAL DISPLAY DEVICE AND LIQUID CRYSTAL DISPLAY DEVICE MANUFACTURED USING THE SAME

(75) Inventors: Dae-Jin Jeon, Gyeonggi-Do (KR); Jae-Ho Yang, Daejeongwangyeoksi (KR)

(73) Assignee: LG.Philips LCD Co., Ltd, Seoul (KR)

( * ) Notice: Subject to any disclaimer, the term of this patent is extended or adjusted under 35 U.S.C. 154(b) by 483 days.

(21) Appl. No.: 11/149,276

(22) Filed: Jun. 10, 2005

(65) Prior Publication Data

US 2005/0285982 A1  Dec. 29, 2005

(30) Foreign Application Priority Data

Jun. 29, 2004  (KR) .................. 10-2004-0049527

(51) Int. Cl.
*G02F 1/1341* (2006.01)
*G02F 1/13* (2006.01)
*G02F 1/136* (2006.01)

(52) U.S. Cl. .................. 349/189; 349/187; 349/42

(58) Field of Classification Search ................ 349/187, 349/189, 42, 43

See application file for complete search history.

(56) References Cited

U.S. PATENT DOCUMENTS

| | | | |
|---|---|---|---|
| 6,179,920 B1 * | 1/2001 | Tarutani et al. ............. | 118/715 |
| 6,383,896 B1 * | 5/2002 | Kirimura et al. ........... | 438/478 |
| 6,417,111 B2 * | 7/2002 | Nishikawa et al. ......... | 438/710 |
| 6,905,079 B2 * | 6/2005 | Kuwada et al. ............... | 239/13 |
| 7,138,336 B2 * | 11/2006 | Lee et al. .................... | 438/680 |
| 2005/0156063 A1 * | 7/2005 | Tsuji et al. ................. | 239/548 |

FOREIGN PATENT DOCUMENTS

JP  5-55172 A  3/1993

\* cited by examiner

*Primary Examiner*—Mike Qi
(74) *Attorney, Agent, or Firm*—McKenna Long & Aldridge LLP

(57) ABSTRACT

An apparatus for forming a thin film on a substrate includes a chamber having a gas inlet, an upper electrode in the chamber, the upper electrode having a plurality of nozzles, a lower electrode in the chamber for supporting the substrate thereon, the lower electrode being spaced apart from the upper electrode, and a selective injection plate above the upper electrode, the selective injection plate including a selective injection valve for selectively concentrating a gas supplied through the gas inlet onto a portion of the upper electrode.

20 Claims, 3 Drawing Sheets

APPARATUS FOR MANUFACTURING LIQUID CRYSTAL DISPLAY DEVICE AND LIQUID CRYSTAL DISPLAY DEVICE MANUFACTURED USING THE SAME

The present invention claims the benefit of Korean Patent Application No. 2004-0049527 filed in Korea on Jun. 29, 2004, which is hereby incorporated by reference.

BACKGROUND OF THE INVENTION

1. Field of the Invention

The present invention relates to an apparatus and a method thereof for forming a thin film, and more particularly, to an apparatus for forming a thin film on a substrate and a liquid crystal display device manufactured using the same.

2. Discussion of the Related Art

Due to rapid development in information technology, display devices have to display large amounts of information. Although cathode ray tube (CRT) devices have been commonly used as display devices, flat panel display devices that are thin, light weight, and low in power consumption have been actively developed. Among these, liquid crystal display (LCD) devices have been widely used in notebook computer monitors, personal computer monitors, office automation instruments such as photocopiers, and handheld devices such as cellular phones and pagers, because of their superior image resolution, color image display, and display image quality.

An LCD device includes an upper substrate, a lower substrate, and a liquid crystal material layer disposed between the upper and lower substrates. The LCD device uses optical anisotropy and birefringence characteristics of liquid crystal molecules in the liquid crystal material layer to produce image data by controlling an electric field applied to the liquid crystal material layers, thereby altering an arrangement of the liquid crystal molecules and varying light transmittance thereof.

An LCD device also includes a thin film transistor that functions as a switching element. Such an LCD device that includes the thin film transistor is commonly referred to as an active matrix liquid crystal display (AMLCD) device. An AMLCD device has high image resolution and can display moving images.

In general, an AMLCD device is manufactured through processes of cleaning substrates, forming patterns on the substrates, forming alignment layers, attaching the substrates, forming a liquid crystal layer between the substrates, and packaging circuits. The process of cleaning the substrates may be performed before and after the process of forming the patterns on the substrates, and particles on the substrates are removed by cleaning agents during the process of cleaning the substrates.

In addition, the process of forming patterns on the substrates is divided into a process of forming patterns on an upper substrate and a process of forming patterns on a lower substrate. During the process of forming patterns on the upper substrate, a color filter layer, a black matrix and a common electrode are formed on the upper substrate. During the process of forming patterns on the lower substrate, gate lines and data lines crossing each other to define pixel regions, a thin film transistor connected to each crossing of the gate and data lines, a pixel electrode connected to the thin film transistor in each pixel region are formed on the lower substrate.

Further, alignment layers are coated on respective substrates after patterns are formed thereon and are rubbed. Next, a sealant may be formed on the lower substrate to attach the lower and upper substrates. Liquid crystal then is injected between the attached substrates through an injection hole to form a liquid crystal layer, and the injection hole is sealed.

Moreover, the attached substrates including the liquid crystal layer therebetween passes through another cleaning process and a grinding process to form a liquid crystal panel. Integrated circuits are attached to the liquid crystal panel.

Apparatuses for manufacturing a liquid crystal display device include airtight chambers so that the processes are performed under high vacuum. A cluster chamber, which can treat a plurality of substrates in a short time, has been widely used. A cluster chamber includes process chambers, a load lock chamber, and a transfer chamber. In particular, in the process chambers, processes for directly treating substrates are performed. The transfer chamber stores the substrates and transfers the substrates into or out of the process chambers. The process chambers include a chamber for a plasma enhanced chemical vapor deposition (PECVD) apparatus and a chamber for a dry etch apparatus.

FIG. 1 is a cross-sectional view illustrating a dry etching apparatus for manufacturing a liquid crystal display device according to the related art, and FIG. 2 is a plan view illustrating an upper electrode of the dry etching apparatus shown in FIG. 1. As shown in FIG. 1, a dry etching apparatus includes a gas inlet 12 formed in an upper side of a chamber 10 and a gas outlet 11 formed in a lower side of the chamber 10. Gases are injected into the chamber 10 through the gas inlet 12 from a gas-storing unit (not shown) and exhausted from the chamber 10 through the gas outlet 11.

In addition, the chamber 10 includes a lower electrode 21 and an upper electrode 31 spaced apart from each other. A substrate 22, which includes a thin film to be patterned, is loaded on the lower electrode 21 inside the chamber 10. In particular, the lower electrode 21 is connected to an outer power supplier 13, which applies a radio frequency (RF) power to the lower electrode 21.

Further, the space between the lower electrode 21 and the upper electrode 31 often is referred to a reaction region. In particular, the upper electrode 31 is grounded and has a plurality of holes 32. As shown in FIG. 2, the holes 32 are arranged in a matrix manner across the upper electrode 31.

Referring back to FIG. 1, the chamber 10 further includes gas injection plates, 41, 42 and 43, disposed over the upper electrode 31 for evenly distributing the gases injected through the gas inlet 12. The number of gas injection plates, 41, 42 and 43, may vary based on demands. Thus, the gases are uniformly injected and provided to the upper electrode 31. Then, the gases are spread into the reaction region between the upper electrode 31 and the lower electrode 21 through the plurality of holes 32 of the upper electrode 31.

Moreover, the chamber 10 includes lower and upper shields 23 and 33 formed around the lower electrode 21 and the upper electrode 31, respectively. A part of the upper shield 33 extends into the reaction region, so that a density of plasma increases in an area corresponding to the substrate 22.

However, it becomes difficult for the dry etch apparatus of the related art to uniformly spread gases onto the entire surface of the substrate as the size of the substrate increases. In addition, the dry etch apparatus according to the relate art does not provide different etch rates for a center portion and an edge portion of the substrate even when a layer should be differently etched across the surface of the substrate. For example, an active layer is further etched in the edge portion of the substrate, while a passivation layer is further etched in the center portion of the substrate.

SUMMARY OF THE INVENTION

Accordingly, the present invention is directed to an apparatus for manufacturing a liquid crystal display device and a liquid crystal display device manufactured using the same that substantially obviate one or more of the problems due to limitations and disadvantages of the related art.

An object of the present invention is to provide an apparatus for manufacturing a liquid crystal display device that selectively treats regions of a substrate and a liquid crystal display device manufactured using the same.

Another object of the present invention is to provide an apparatus for manufacturing a liquid crystal display device that selectively provides gases across the surface of a substrate and deposits/etches a thin film at a varying rate across the surface of the substrate according to positions, and a liquid crystal display device manufactured using the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an apparatus for forming a thin film on a substrate includes a chamber having a gas inlet, an upper electrode in the chamber, the upper electrode having a plurality of nozzles, a lower electrode in the chamber for supporting the substrate thereon, the lower electrode being spaced apart from the upper electrode, and a selective injection plate above the upper electrode, the selective injection plate including a selective injection valve for selectively concentrating a gas supplied through the gas inlet onto a portion of the upper electrode.

In another aspect, a liquid crystal display device includes a first substrate, a second substrate, one of the first and second substrates having a thin film formed by an apparatus for forming a thin film on a substrate includes a chamber having a gas inlet, an upper electrode in the chamber, the upper electrode having a plurality of nozzles, a lower electrode in the chamber for supporting the substrate thereon, the lower electrode being spaced apart from the upper electrode, and a selective injection plate above the upper electrode, the selective injection plate including a selective injection valve for selectively concentrating a gas supplied through the gas inlet onto a portion of the upper electrode, and a liquid crystal layer between the first and second substrates.

In yet another aspect, a method for forming a thin film on a substrate includes supplying a gas into a chamber, selectively moving a selective injection valve of a selective injection plate in the chamber, channeling the gas through the selective injection plate, selectively concentrating the gas onto a portion of an upper electrode inside the chamber using the selective injection valve, and injecting the gas across the substrate supported by a lower electrode at a varying gas injection rate across a surface of the substrate, the upper and lower electrodes spaced apart from each other.

In another aspect, a liquid crystal display device includes a first substrate, a second substrate, one of the first and second substrates having a thin film formed by a method for forming a thin film on a substrate includes supplying a gas into a chamber, selectively moving a selective injection valve of a selective injection plate in the chamber, channeling the gas through the selective injection plate, selectively concentrating the gas onto a portion of an upper electrode inside the chamber using the selective injection valve, and injecting the gas across the substrate supported by a lower electrode at a varying gas injection rate across a surface of the substrate, the upper and lower electrodes spaced apart from each other, and a liquid crystal layer between the first and second substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
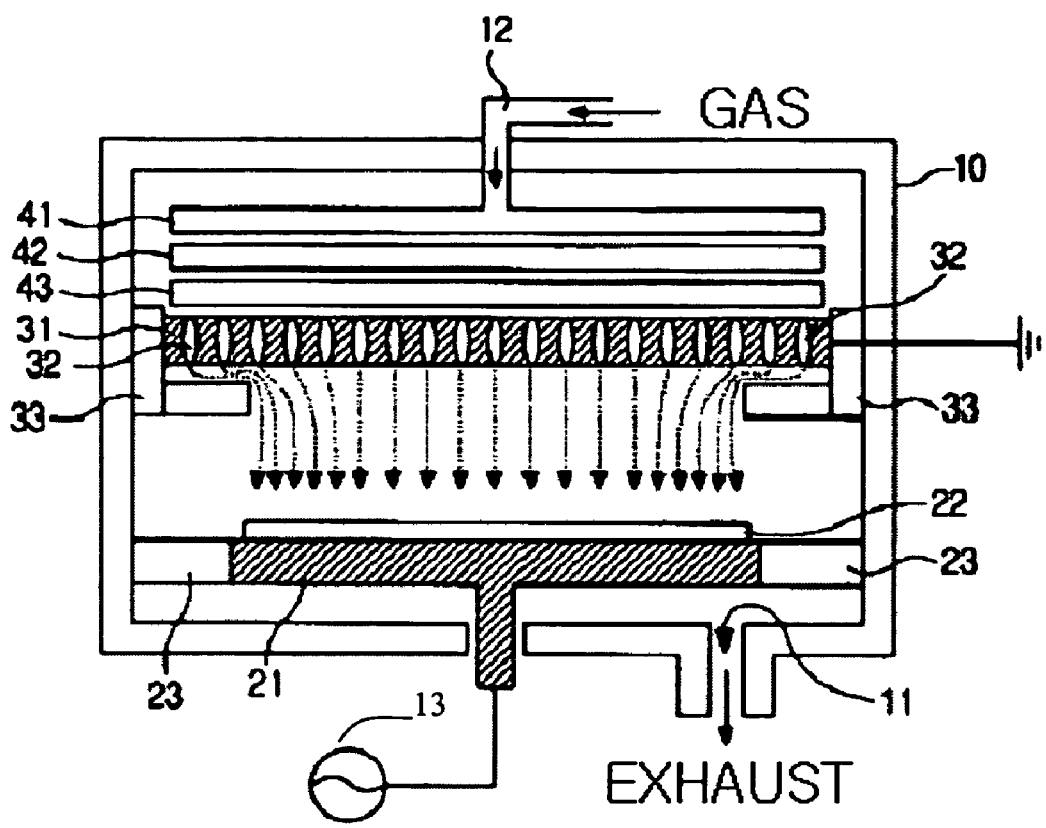
FIG. 1 is a cross-sectional view illustrating a dry etching apparatus for manufacturing a liquid crystal display device according to the related art.
Figure 2:
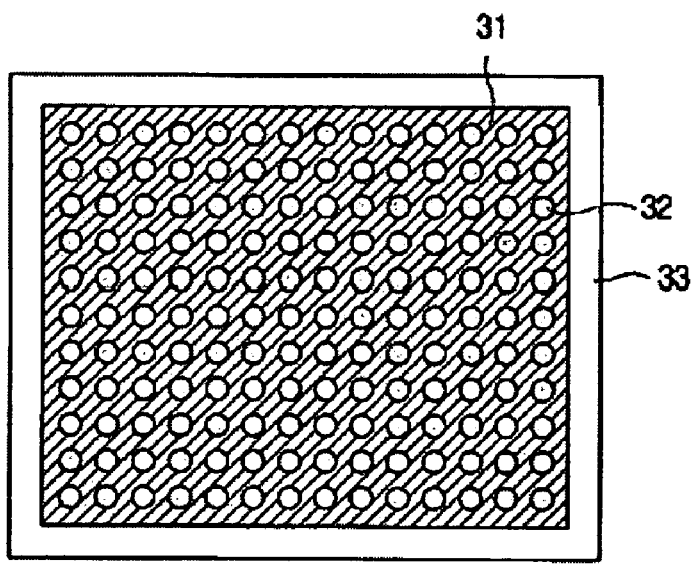
FIG. 2 is a plan view illustrating an upper electrode of the dry etching apparatus shown in FIG. 1.
Figure 3:
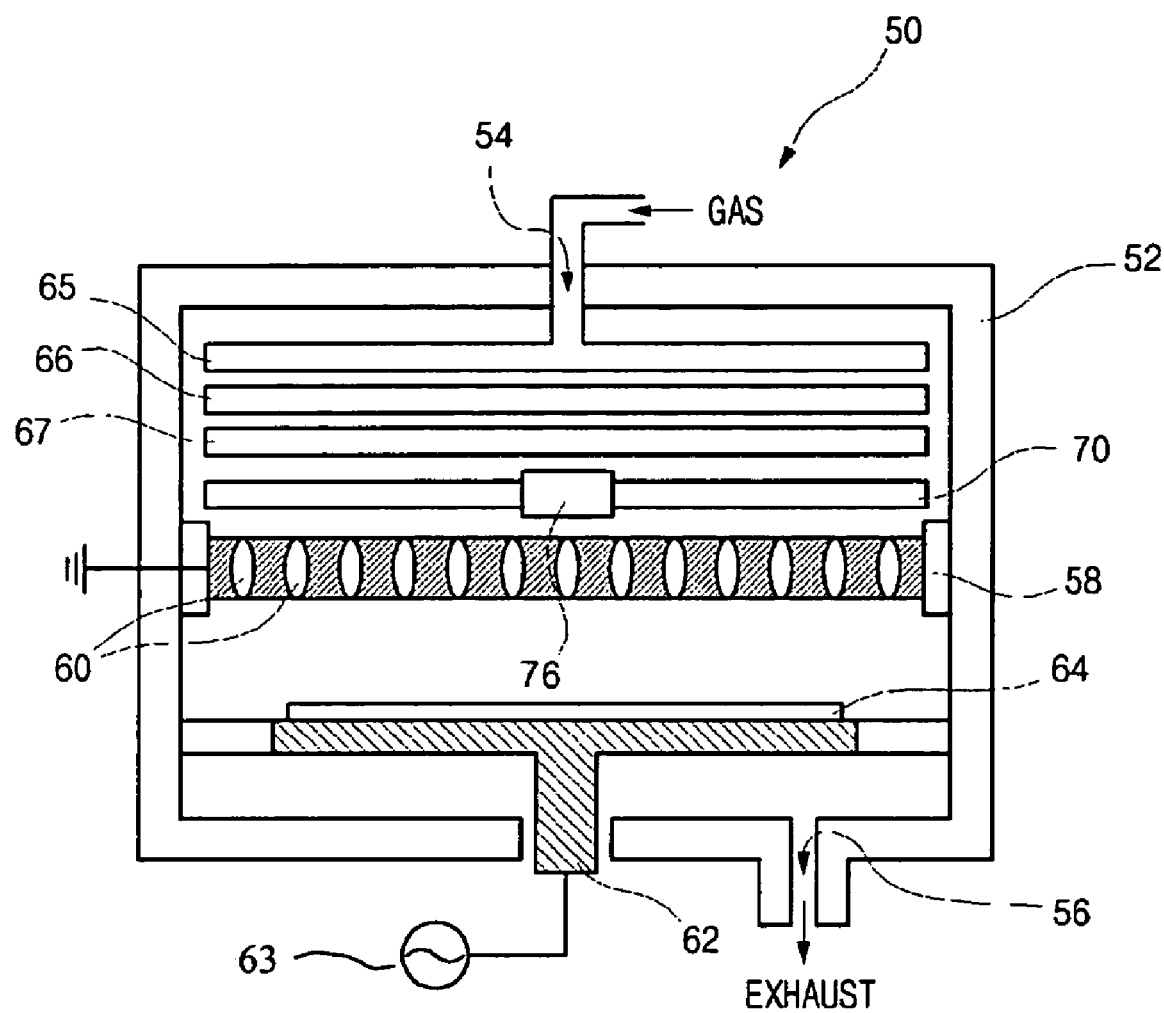
FIG. 3 is a cross-sectional schematic view illustrating an apparatus for manufacturing a liquid crystal display device according to an embodiment of the present invention.

FIG. 3 is a cross-sectional schematic view illustrating an apparatus for manufacturing a liquid crystal display device according to an embodiment of the present invention. In FIG. 3, an apparatus 50 includes a chamber 52. A gas inlet 54 is formed in an upper side of the chamber 52, and a gas outlet 56 is formed in a lower side of the chamber 52. Gases are injected into the chamber 52 through the gas inlet 54 from a gas-storing unit (not shown) and exhausted from the chamber 52 through the gas outlet 56. The apparatus 50 may be a dry etching apparatus or a plasma etching apparatus. Further, the apparatus 50 may be a chemical vapor deposition (CVD) apparatus or a plasma enhanced chemical vapor deposition (PECVD) apparatus.

In addition, the chamber 52 includes a lower electrode 62 and an upper electrode 58 spaced apart from each other. A substrate 64 is loaded on the lower electrode 62 inside the chamber 52, and the substrate 64, for example, may include a thin film to be patterned by an etching process. In particular, the lower electrode 62 is connected to an outer power supplier 63, which may be located outside the chamber 52 and may apply a radio frequency (RF) power to the lower electrode 62.

Further, the space between the lower electrode 62 and the upper electrode 58 often is referred to a reaction region. In particular, the upper electrode 58 is grounded and includes a plurality of injection nozzles 60 for injecting the gases provided through the gas inlet 54. The injection nozzles 60 may be arranged in a matrix manner across the upper electrode 58.

The chamber 52 further includes gas injection plates, 65, 66 and 67, disposed over the upper electrode 58. In particular, each of the gas injection plates, 65, 66 and 67, includes a plurality of nozzles (not shown) for evenly distributing the gases injected through the gas inlet 54. The number of gas injection plates, 65, 66 and 67, may vary based on demands, such that the apparatus 50 may have at least one gas injection plate.

Moreover, the chamber 52 includes a selective injection plate 70 disposed between the upper electrode 58 and the gas injection plates, 65, 66, and 67. In particular, the selective injection plate 70 controls the gas distribution across the upper electrode 58 by using a selective injection valve 76. Accordingly, the gases injected through the gas inlet 54 are selectively spread across the substrate 64 through the nozzles of the gas injection plates 65, 66 and 67, through the selective injection valve 76, and then through the injection nozzles 60 of the upper electrode 58.

Figure 4A:
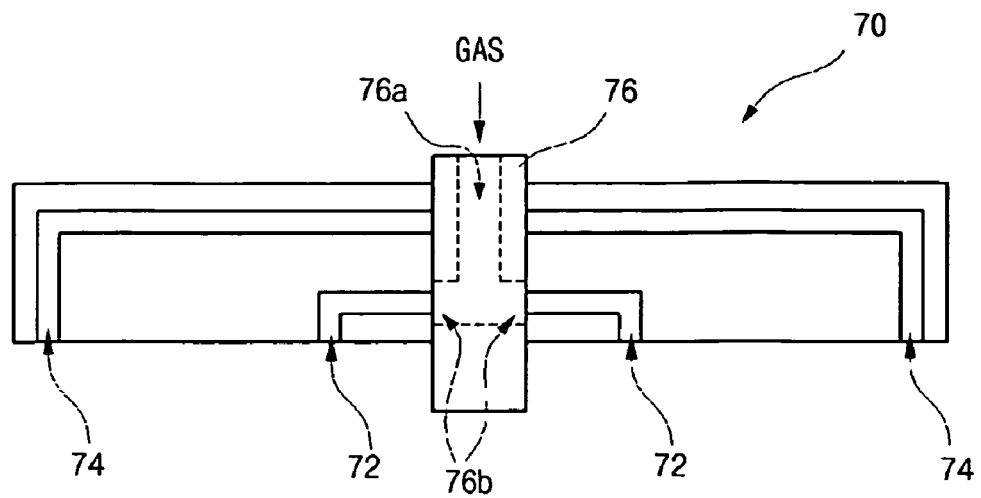
FIGS. 4A and 4B are cross-sectional views illustrating an injection plate of an apparatus according to an embodiment of the present invention.
Figure 4B:
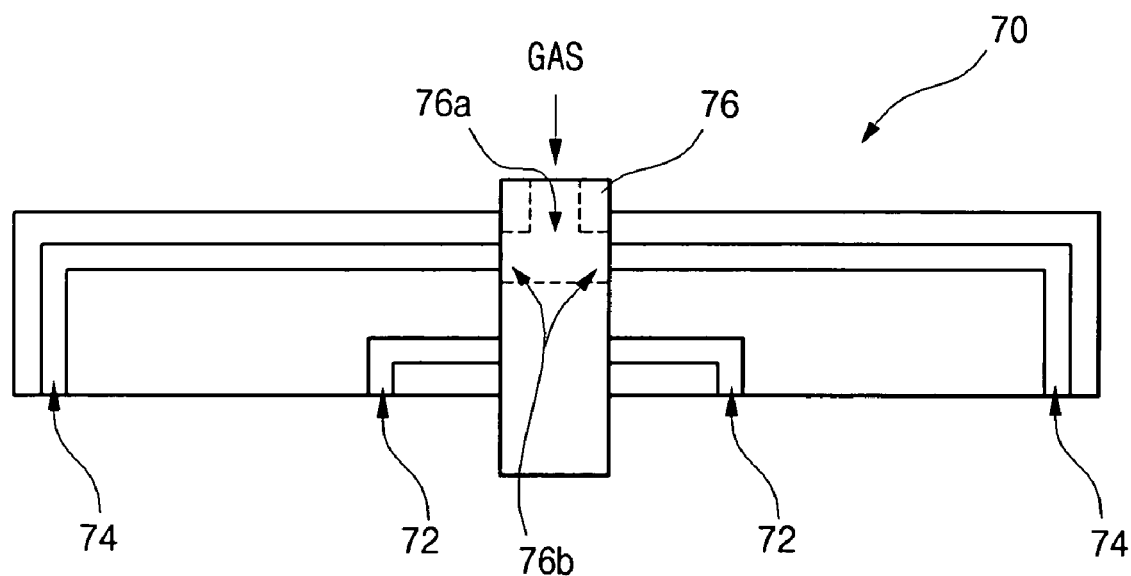

FIGS. 4A and 4B are cross-sectional views illustrating an injection plate of an apparatus according to an embodiment of the present invention. In FIGS. 4A and 4B, a selective injection plate 70 includes at lease one first injection hole 72 and at least one second injection hole 74. The first injection hole 72 may correspond to a center portion of an upper electrode 58 (shown in FIG. 3) for concentrating gases onto a center portion of a substrate 64 (shown in FIG. 3). In addition, the second injection hole 74 may correspond to an edge portion of the upper electrode 58 (shown in FIG. 3) for concentrating gases onto an edge portion of the substrate 64 (shown in FIG. 3).

The selective injection plate 70 further includes a selective injection valve 76 in the center of the selective injection plate 70 for selectively injecting gases through either the first injection hole 72 or the second injection hole 74. The selective injection valve 76 may independently move up and down controlled by a control system outside the chamber 52. In particular, the selective injection valve 76 includes a first hole 76a and a second hole 76b. The first hole 76a and the second hole 76b may connect to one another. The first hole 76a also may have an opening at an upper surface of the selective injection valve 76, and the second hole 76b may have an opening at a side surface of the selective injection valve 76. For example, the first hole 76a and the second hole 76b may be connected to one another and may form an inverted "T" shape.

As shown in FIG. 4A, when the selective injection valve 76 is moved to a lower position, the second hole 76b may be connected to the first injection hole 72 for injecting gases through the first injection hole 72. Accordingly, when the second hole 76b of the selective injection valve 76 corresponds to the first injection hole 72, gases supplied through the gas injection plates 65, 66 and 67 (shown in FIG. 3) pass through the first hole 76a, the second hole 76b and then the first injection hole 72 to the center portion of the upper electrode 58 (shown in FIG. 3).

As shown in FIG. 4B, when the selective injection valve 76 is moved to an upper position, the second hole 76b may be connected to the second injection hole 74 for injecting gases through the second injection hole 74. Accordingly, when the second hole 76b of the selective injection valve 76 corresponds to the second injection hole 74, gases supplied through the gas injection plates 65, 66 and 67 (shown in FIG. 3) pass through the first hole 76a, the second hole 76b and then the second injection hole 74 to the edge portion of the upper electrode 58 (shown in FIG. 3).

Further, although not shown, a solenoid may be equipped for selectively moving the selective injection valve 76 up and down. Therefore, the selective injection valve 76 moves according to control signals applied to the solenoid from an outer system (not shown).

Moreover, although not shown, the selective injection valve 76 may include more than first and second injection holes and may be moved to a position other than the upper and lower positions, thereby more minutely controlling the gases distribution. For example, the selective injection valve 76 may include first, second and third injections holes for respectively concentrating gases onto the center, the middle and the edge portion of the upper electrode 58 (shown in FIG. 3). As a result, by moving the selective injection valve 76, gases are selectively injected through either the first injection hole 72 or the second injection hole 74. Thus, the gas injection rate may be varying.

Accordingly, the gases injected through the gas inlet 54 (shown in FIG. 3) are selectively spread across the substrate 64 (shown in FIG. 3) through the nozzles of the gas injection plates 65, 66 and 67 (shown in FIG. 3), through the first and second holes 76a and 76b of the selective injection valve 76, one of the first and second injection holes 72 and 74, and then through the injection nozzles 60 of the upper electrode 58.

Therefore, the apparatus according to an embodiment of the present invention includes a selective injection plate for selectively concentrating gases onto at least a center portion and an edge portion of an upper electrode. Thus, the apparatus according to an embodiment of the present invention selectively treats regions of a substrate and selectively controls a gas injection rate across the surface of the substrate, thereby depositing/etching a thin film across the surface of the substrate at variable rates.

Although not shown, the apparatus according to an embodiment of the present invention may be used for depositing/etching a thin film on any type of substrate, for example, an insulative substrate or a semiconductor substrate.

It will be apparent to those skilled in the art that various modifications and variations can be made in the apparatus for manufacturing a liquid crystal display device and a liquid crystal display device manufactured using the same of the present invention without departing from the spirit or scope of the invention. Thus, it is intended that the present invention covers the modifications and variations of this invention provided they come within the scope of the appended claims and their equivalents.

What is claimed is:

1. An apparatus for forming a thin film on a substrate, comprising:
   a chamber having a gas inlet;
   an upper electrode in the chamber, the upper electrode having a plurality of nozzles;
   a lower electrode in the chamber for supporting the substrate thereon, the lower electrode being spaced apart from the upper electrode; and
   a selective injection plate above the upper electrode, the selective injection plate including a selective injection valve for selectively concentrating a gas supplied through the gas inlet onto a portion of the upper electrode.

2. The apparatus according to claim 1, wherein the selective injection valve includes at least a first hole and a second hole connected to one another, the first hole having an opening at an upper surface of the selective injection valve and the second hole having an opening at a side surface of the selective injection valve.

3. The apparatus according to claim 1, wherein the selective injection valve includes at least a first hole and a second hole connected to one another, the first and second holes forming an inverted "T" shape.

4. The apparatus according to claim 1, wherein the selective injection valve is movable by a solenoid.

5. The apparatus according to claim 1, wherein the selective injection valve is in a center portion of the selective injection plate.

6. The apparatus according to claim 1, wherein the selective injection plate includes at least a first hole corresponding to a center portion of the upper electrode and a second hole corresponding to an edge portion of the upper electrode.

7. The apparatus according to claim 6, wherein the selective injection plate includes at least a third hole between the first and second holes, the third hole corresponding to a portion between the center portion and the edge portion of the upper electrode.

8. The apparatus according to claim 1, wherein the apparatus is one of an etching apparatus and a chemical vapor deposition apparatus.

9. The apparatus according to claim 1, further comprising at least one gas injection plate between the gas inlet and the selective injection plate.

10. The apparatus according to claim 1, further comprising a power supplier connected to the upper and lower electrodes.

11. A liquid crystal display device, comprising:
a first substrate;
a second substrate, one of the first and second substrates having a thin film formed by the apparatus of claim 1; and
a liquid crystal layer between the first and second substrates.

12. A method for forming a thin film on a substrate, comprising:
supplying a gas into a chamber;
selectively moving a selective injection valve of a selective injection plate in the chamber;
channeling the gas through the selective injection plate;
selectively concentrating the gas onto a portion of an upper electrode inside the chamber using the selective injection valve; and
injecting the gas across the substrate supported by a lower electrode at a varying gas injection rate across a surface of the substrate, the upper and lower electrodes spaced apart from each other.

13. The method according to claim 12, wherein the selectively moving the selective injection valve includes moving the selective injection valve to one of an upper location and a lower location.

14. The method according to claim 12, wherein the channeling the gas through the selective injection plate includes channeling the gas through one of a first injection hole and a second injection hole, the first injection hole corresponding to a center portion of the upper electrode and the second injection hole corresponding to an edge portion of the upper electrode.

15. The method according to claim 12, wherein the channeling the gas through the selective injection plate includes channeling the gas through one of a first injection hole, a second injection hole and a third injection hole, the first injection hole corresponding to a center portion of the upper electrode, the second injection hole corresponding to an edge portion of the upper electrode and the third injection hole corresponding to a portion between the center portion and the edge portion of the upper electrode.

16. The method according to claim 12, wherein the selectively concentrating the gas using the selective injection valve includes channeling the gas supplied from a gas inlet through a first hole of the selective injection valve and then through a second hole of the selective injection valve, the first hole having an opening at an upper surface of the selective injection valve and the second hole having an opening at a side surface of the selective injection valve.

17. The method according to claim 12, wherein the selectively concentrating the gas using the selective injection valve includes channeling the gas supplied from a gas inlet through a first hole of the selective injection valve and then through a second hole of the selective injection valve, the first and second holes of the selective injection valve connected to one another and forming an inverted "T" shape.

18. The method according to claim 12, wherein the varying gas injection rate is a part of an etching process or a chemical vapor deposition process.

19. The method according to claim 12, further comprising: before the gas is channeled through the selective injection plate, distributing the gas supplied from a gas inlet through at least one gas injection plate.

20. A liquid crystal display device, comprising:
a first substrate;
a second substrate, one of the first and second substrates having a thin film formed by the method of claim 12; and
a liquid crystal layer between the first and second substrates.

* * * * *